United States Patent
Liou et al.

(10) Patent No.: US 10,600,924 B2
(45) Date of Patent: Mar. 24, 2020

(54) SOLAR ENERGY ABSORBING DEVICE

(71) Applicant: National Chung Hsing University, Taichung (TW)

(72) Inventors: Yu-Chen Liou, Taichung (TW); Fu-Hsing Lu, Taichung (TW)

(73) Assignee: NATIONAL CHUNG HSING UNIVERSITY, Taichung (TW)

( * ) Notice: Subject to any disclaimer, the term of this patent is extended or adjusted under 35 U.S.C. 154(b) by 0 days.

(21) Appl. No.: 16/160,565

(22) Filed: Oct. 15, 2018

(65) Prior Publication Data

US 2019/0378938 A1 Dec. 12, 2019

(30) Foreign Application Priority Data

Jun. 6, 2018 (TW) .............. 107119497 A

(51) Int. Cl.
| | |
|---|---|
| *C23C 14/34* | (2006.01) |
| *H01L 31/0216* | (2014.01) |
| *H01L 31/024* | (2014.01) |
| *H01L 31/0392* | (2006.01) |
| *C23C 14/06* | (2006.01) |
| *C23C 14/08* | (2006.01) |
| *C23C 16/30* | (2006.01) |

(52) U.S. Cl.
CPC .... *H01L 31/02168* (2013.01); *C23C 14/0641* (2013.01); *C23C 14/0676* (2013.01); *C23C 14/0688* (2013.01); *C23C 14/083* (2013.01); *H01L 31/024* (2013.01); *H01L 31/0392* (2013.01); *C23C 16/308* (2013.01)

(58) Field of Classification Search
CPC ............ C23C 14/0641; C23C 14/0676; C23C 14/0688; C23C 14/083; C23C 16/308; C23C 16/34; C23C 16/405; H01L 21/02175; H01L 21/02181–02189
See application file for complete search history.

(56) References Cited

U.S. PATENT DOCUMENTS

| | | | | |
|---|---|---|---|---|
| 4,920,006 | A * | 4/1990 | Gillery ................ | C23C 14/0015 428/432 |
| 5,618,579 | A * | 4/1997 | Boire .................... | C03C 17/225 427/164 |
| 5,670,248 | A * | 9/1997 | Lazarov ................ | G02B 1/113 428/304.4 |

(Continued)

FOREIGN PATENT DOCUMENTS

CN 102721208 A * 10/2012

OTHER PUBLICATIONS

Machine translation of CN 102721208A, obtained from Google Patents (Year: 2019).*

(Continued)

*Primary Examiner* — Z. Jim Yang
(74) *Attorney, Agent, or Firm* — Muncy, Geissler, Olds & Lowe, PC

(57) ABSTRACT

A solar energy absorbing device includes a substrate and a solar selective absorber film. The solar selective absorber film has a bottom surface attached on the substrate, and a top surface opposite to the bottom surface. The solar selective absorber film is a $TiN_xO_y$ based film, and x and y vary from 1 to 0.1 and 0.2 to 2, respectively, from the bottom surface to the top surface of the solar selective absorber film.

5 Claims, 1 Drawing Sheet

(56) References Cited

U.S. PATENT DOCUMENTS

| | | | |
|---|---|---|---|
| 9,540,729 B1* | 1/2017 | Okura | C23C 16/45525 |
| 9,564,310 B1* | 2/2017 | Adusumilli | H01L 21/02266 |
| 9,941,142 B1* | 4/2018 | Arceo De La Pena | H01L 21/32139 |
| 2003/0175444 A1* | 9/2003 | Huang | A61L 27/306 427/523 |
| 2007/0196670 A1* | 8/2007 | Barshilia | C23C 14/568 428/446 |
| 2008/0121962 A1* | 5/2008 | Forbes | C23C 16/308 257/310 |
| 2010/0035034 A1* | 2/2010 | Yin | C23C 14/0676 428/216 |
| 2010/0313875 A1* | 12/2010 | Kennedy | F24S 10/45 126/652 |
| 2012/0224256 A1* | 9/2012 | Dasbach | B23K 26/18 359/350 |
| 2013/0125876 A1* | 5/2013 | Andritschky | C23C 14/0036 126/676 |
| 2013/0344248 A1* | 12/2013 | Clark | C23C 16/34 427/255.393 |
| 2014/0093748 A1* | 4/2014 | Chen | G11B 5/73 428/831 |
| 2014/0329073 A1* | 11/2014 | Barshilia | C23C 14/021 428/216 |
| 2016/0040912 A1* | 2/2016 | Chandra | F24S 70/20 428/216 |
| 2018/0076342 A1* | 3/2018 | Liu | C23C 14/0641 |
| 2019/0226075 A1* | 7/2019 | Derflinger | C23C 28/042 |

OTHER PUBLICATIONS

Chen et al., Control of optical properties of TiNxOy films and application for high performance solar selective absorbing coatings, Optical Materials Expr.*

* cited by examiner

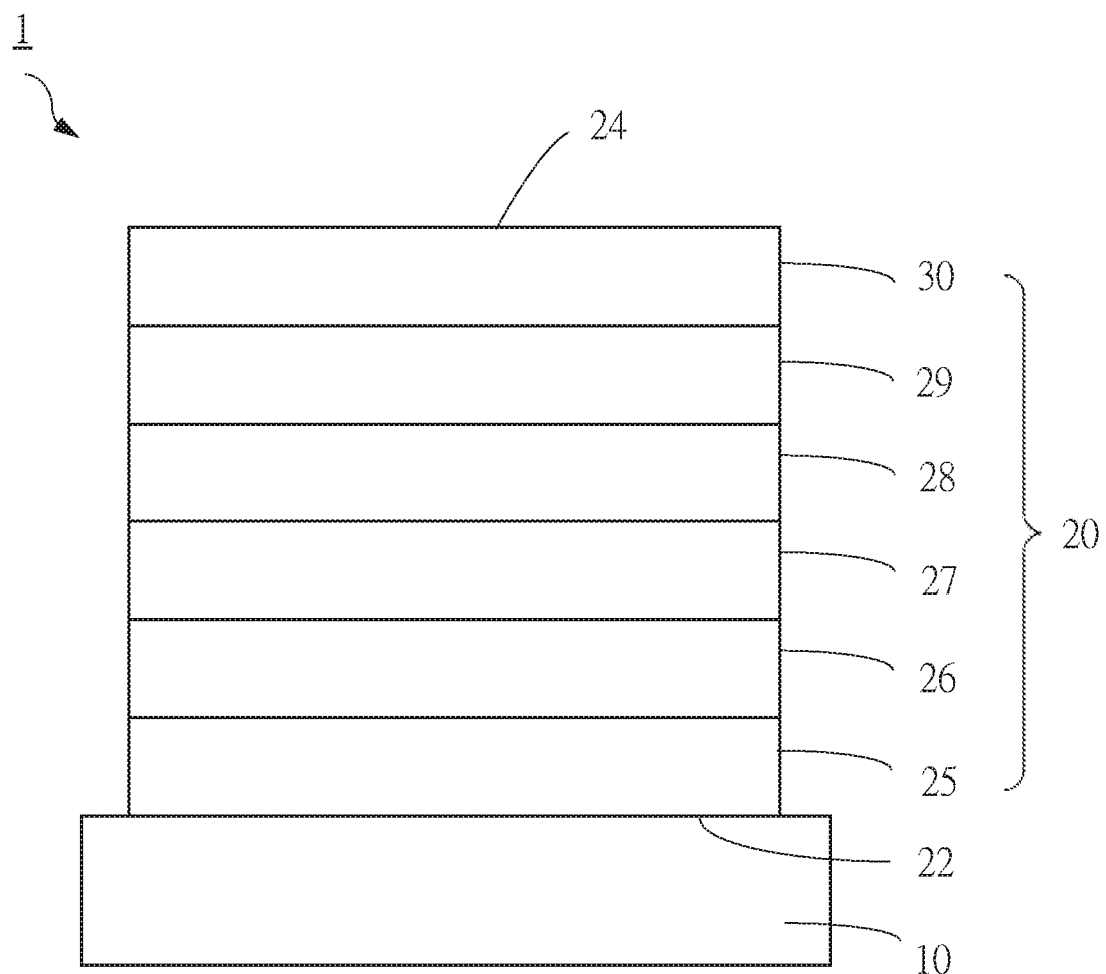

SOLAR ENERGY ABSORBING DEVICE

BACKGROUND OF THE INVENTION

1. Field of the Invention

The present invention relates generally to a solar energy absorbing device and more particularly, to a solar energy absorbing device having a solar selective absorber film, which has a simple structure and is time and cost saving in manufacturing thereof.

2. Description of the Related Art

A conventional solar energy absorbing device is configured having a plurality of coating layers on a substrate for enhancing solar absorptance and reducing thermal emittance. The substrate is generally made of glass or metals, such as stainless steel, copper alloy, etc. The plurality of coating layers generally comprise successively from bottom to top an IR reflecting layer made of metal and deposited on the surface of the substrate, a selective absorbing layer capable of enhancing solar absorptance, and an anti-reflection layer having high transparency for enhancing light admission and reducing light reflection. With such multi-layered coating structure, the solar absorptance can be effectively increased.

However, the above-mentioned multi-layered coating structure is made by three individual steps of successively depositing three thin layers of different compounds on the substrate layer by layer. As such, the manufacturing method of the conventional solar energy absorbing device is labor and time consuming, resulting in high manufacturing cost and low market competitiveness.

SUMMARY OF THE INVENTION

The present invention has been accomplished in view of the above-noted circumstances. It is an objective of the present invention to provide a solar energy absorbing device having a solar selective absorber film, which has a simple structure and is time and cost saving in manufacturing with high potential of market competitiveness.

To attain the above objective, the present invention provides a solar energy absorbing device consisting of a substrate and a solar selective absorber film having a bottom surface attached on the substrate, and a top surface opposite to the bottom surface. The solar selective absorber film is a $TiN_xO_y$ based film. From the bottom surface to the top surface of the solar selective absorber film, x varies from 1 to 0.1 and y varies from 0.2 to 2. As a result, the solar energy absorbing device has a simple structure and can be made in a short time with low manufacturing cost, thereby possessing high potential of market competitiveness.

Preferably, x varies from 0.89 to 0.23 and y varies from 0.37 to 1.91 from the bottom surface to the top surface of the solar selective absorber film.

In an embodiment, x and y discretely vary from the bottom surface to the top surface of the solar selective absorber film.

In another embodiment, x and y continuously vary from the bottom surface to the top surface of the solar selective absorber film.

Preferably, the substrate is made of metal, glass or silicon.

BRIEF DESCRIPTION OF THE DRAWINGS

The present invention will become more fully understood from the detailed description given herein below and the accompanying drawing which is given by way of illustration only, and thus is not limitative of the present invention, and wherein:

The sole FIGURE is a schematically sectional view of a solar energy absorbing device according to an embodiment of the present invention.

DETAILED DESCRIPTION OF THE INVENTION

The structure and technical features of the present invention will be detailedly described hereunder by an embodiment and accompany drawing. As shown in the FIGURE, a solar energy absorbing device 1 provided in accordance with an embodiment of the present invention is composed of a substrate 10 and a solar selective absorber film 20.

The substrate 10 is made of stainless steel in this embodiment. In other embodiment, any feasible material, such as silicon, glass, copper, and other metal materials, may be used to make the substrate 10.

The solar selective absorber film 20 has a bottom surface 22 attached on the substrate 10, and a top surface 24 opposite to the bottom surface 22. The solar selective absorber film 20 is a $TiN_xO_y$ based film, namely the solar selective absorber film 20 may be made by $TiN_xO_y$ only or the solar energy absorbing film 20 may be made by $TiN_xO_y$ with one or more components. Further, from the bottom surface 22 to the top surface 24, x varies from 0.89 to 0.23 and y varies from 0.37 to 1.91. In this embodiment, the ingredient of the solar selective absorber film 20 varies in a discrete, stepwise manner. For example, as shown in the FIGURE, the solar selective absorber film 20 is composed of six layers, namely successively from the bottom surface 22 to the top surface 24 a first layer 25, a second layer 26, a third layer 27, a fourth layer 28, a fifth layer 29 and a sixth layer 30, having a thickness of 200 nm in total. The x and y values of each of the six layers are shown in the following Table 1. These values were obtained by using X-ray photoelectron spectroscopy (ULVAC-PHI PHI 5000 VersaProbe) to identify peaks of Ti-2p, N-1s and O-1s of each layer and calculate peak integral area I of each element and using the following formula with given sensitivity factor F of each element from existing papers.

$$A[\text{at \%}] = \left[ \frac{\frac{I_A}{F_A}}{\sum \frac{I_i}{F_i}} \right] \times 100\%$$

TABLE 1

| | x | y |
|---|---|---|
| #6 layer | 0.23 | 1.91 |
| #5 layer | 0.29 | 1.70 |
| #4 layer | 0.50 | 1.27 |
| #3 layer | 0.65 | 0.93 |
| #2 layer | 0.70 | 0.80 |
| #1 layer | 0.89 | 0.37 |

As shown in Table 1, the N/O ratios of layers 25 to 30 of the $TiN_xO_y$ based film are different. From the first layer 25 to the sixth layer 30, the conductive characteristics of the titanium oxynitrides transform from conductor to semiconductor or even to insulator, and the optical characteristics transform from opaque, translucent to transparent. The titanium oxynitride having characteristic of conductor can serve as the IR reflecting layer made of metal and used in the conventional solar energy absorbing device, the titanium oxynitride having characteristic of semiconductor can serve as the selective absorbent layer used in the conventional solar energy absorbing device, and the transparent and insulated titanium oxynitride can serve as the anti-reflection layer used in the conventional solar energy absorbing device. As such, the solar selective absorber film 20 made of a sole material of $TiN_xO_y$ of the present invention can substitute for the multi-layered coating structure of the conventional solar energy absorbing device.

To verify the effect of the present invention, the solar absorptance and the thermal emittance of the solar energy absorbing device 1 were measured. Solar absorptance was calculated in the range of 0.25-2.5 μm, covering almost all of the solar radiation energy at AM (Air Mass) 1.5. The solar absorptance, i.e. the ratio of the total absorbed solar radiation to the incident solar radiation, is defined as the following formula:

$$\alpha = \frac{\int_{0.25}^{2.5} A(\lambda)I_s(\lambda)d\lambda}{\int_{0.25}^{2.5} I_s(\lambda)d\lambda} = \frac{\int_{0.25}^{2.5} [1-R(\lambda)]I_s(\lambda)d\lambda}{\int_{0.25}^{2.5} I_s(\lambda)d\lambda}$$

$R(\lambda)$ is the reflectance at wavelength ranging from 0.25 μm to 2.5 μm, and $I_s(\lambda)$ is the solar spectral radiation at AM1.5, defined by the ISO standard 9845-1 (1992). The reflectance of the sample in the range of 0.25-2.5 μm was measured by HITACHI U4100 UV/VIS/NIR spectrometer equipped with an integrating sphere based on air as background level. The solar absorptance calculated in accordance with the above-mentioned formula is 85.2%.

The thermal emittance, i.e. the ratio of the thermal radiation of the solar energy absorbing device 1 to that of the blackbody, is defined as the following formula:

$$\varepsilon = \frac{\int_{2.5}^{25} A(\lambda, T)I_b(\lambda, T)d\lambda}{\int_{2.5}^{25} I_b(\lambda, T)d\lambda} = \frac{\int_{2.5}^{25} [1-R(\lambda, T)]I_b(\lambda, T)d\lambda}{\int_{2.5}^{25} I_b(\lambda, T)d\lambda}$$

$I_b(\lambda, T)$ is the blackbody spectral radiation at temperature T based on Planck's law. The reflectance $R(\lambda, T)$ of the sample in the range of 2.5-25 μm at specific temperature was measured by Thermo Scientific Nicolet iS5 Fourier transform infrared (FTIR) spectrometer based on gold as background level. The thermal emittance calculated in accordance with the above-mentioned formula is 7.2%.

According to the above-mentioned measurements, the solar energy absorbing device 1 of this embodiment has a solar absorptance of 85.2% and a thermal emittance of 7.2%. In other words, the solar energy absorbing device 1 has an effect approximately close to that of the conventional solar energy absorbing device having a plurality of coating layers. However, the solar energy absorbing device 1 of the present invention is merely composed of a single solar selective absorber film 20. Though the layers 25 to 30 of the solar selective absorber film 20 have different N and O compositions, the x and y values of $TiN_xO_y$ can be easily adjusted by changing the ratio of air to argon gas during sputtering respective one of the layers 25 to 30. As such, the repeated vacuum pumping procedures in the conventional solar energy absorbing device for successively sputtering the IR reflecting layer of metal, the selective absorbing layer and the anti-reflection layer can be omitted in the present invention. As a result, the solar energy absorbing device 1 of the present invention can be made in a less time with less manufacturing cost so as to enhance market competitiveness of product, achieving the objective of the present invention.

Table 2 shows results of solar energy absorbing devices with different substrates instead of stainless steel in this embodiment. The experimental results show that the solar absorptances and thermal emittances of the solar energy absorbing devices having silicon, glass and copper substrate are approximately equal to that of the solar energy absorbing device 1 having the stainless steel substrate as being disclosed above. Moreover, a further experimental study shows that the solar energy absorbing device can also have a high solar absorptance and a low thermal emittance under the condition that the solar selective absorber film is configured in a gradually changing manner, not a multi-layered structure as disclosed by the foregoing embodiment, i.e. the x and y values continuously and gradually vary, not discretely vary. Furthermore, another experimental study shows that the solar energy absorbing device also has advantageous effects in solar absorptance and thermal emittance under the condition that in the $TiN_xO_y$ based film serving as the solar selective absorber film of the present invention, x varies from 1 to 0.1 and y varies from 0.2 to 2 from the bottom surface to the top surface of the solar selective absorber film.

TABLE 2

| | Solar energy absorbing film/substrate | | |
| --- | --- | --- | --- |
| | $TiN_xO_y$/silicon | $TiN_xO_y$/glass | $TiN_xO_y$/Cu |
| Solar absorptance (%) | 84.3-86.3 | 84.1-86.4 | 82.2 |
| Thermal emittance (%) | 11.3-13.2 | 12.2-15.5 | 6.7 |

The invention being thus described, it will be obvious that the same solar energy absorbing device may be varied in many ways. Such variations are not to be regarded as a departure from the spirit and scope of the invention, and all such modifications as would be obvious to one skilled in the art are intended to be included within the scope of the following claims.

What is claimed is:

1. A solar energy absorbing device consisting of a substrate and a solar selective absorber film having a bottom surface attached on the substrate, and a top surface opposite to the bottom surface;
   wherein the solar selective absorber film is a $TiN_xO_y$ based film; and
   wherein x varies from 0.89 to 0.23 and y varies from 0.37 to 1.91 from the bottom surface to the top surface of the solar selective absorber film.

2. The solar energy absorbing device as claimed in claim 1, wherein x and y discretely vary from the bottom surface to the top surface of the solar selective absorber film.

3. The solar energy absorbing device as claimed in claim 1, wherein x and y continuously vary from the bottom surface to the top surface of the solar selective absorber film.

4. The solar energy absorbing device as claimed in claim 1, wherein the substrate is made of metal, glass or silicon.

5. The solar energy absorbing device as claimed in claim 1, wherein the x and y values of $TiN_xO_y$ are adjusted by changing the ratio of air to argon gas during sputtering.

* * * * *